IMAGE

United States Patent
Yandoc et al.

(10) Patent No.: US 11,538,744 B2
(45) Date of Patent: Dec. 27, 2022

(54) CASCODE SEMICONDUCTOR

(71) Applicant: NEXPERIA B.V., Nijmegen (NL)

(72) Inventors: Ricardo Yandoc, Nijmegen (NL);
Robert Montgomery, Nijmegen (NL);
Adam Thomas Rosillo, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 38 days.

(21) Appl. No.: 17/204,438

(22) Filed: Mar. 17, 2021

(65) Prior Publication Data
US 2021/0296218 A1    Sep. 23, 2021

(30) Foreign Application Priority Data
Mar. 18, 2020 (EP) .................................... 20163929

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4825* (2013.01); *H01L 21/4842* (2013.01);
(Continued)

(58) Field of Classification Search
CPC .......... H01L 23/49575; H01L 21/4825; H01L 21/4842; H01L 21/565; H01L 23/3107; H01L 23/49503; H01L 23/49524; H01L 23/49562; H01L 23/49568; H01L 24/73; H01L 24/92; H01L 24/27; H01L 24/29; H01L 24/32; H01L 24/33; H01L 24/83; H01L 24/84; H01L 24/40; H01L 23/481; H01L 23/49537; H01L 21/50; H01L 23/49517; H01L 24/80; H01L 25/18
(Continued)

(56) References Cited

U.S. PATENT DOCUMENTS 9,385,070 B2 * 7/2016 Tsai ....................... H01L 25/18
2015/0001692 A1   1/2015 Tsai et al.
2015/0214209 A1 * 7/2015 Funatsu ............ H01L 23/49541
                                                                     438/107

FOREIGN PATENT DOCUMENTS

JP         2015056564 A      3/2015

OTHER PUBLICATIONS

Extended European Search Report for corresponding European application EP20163929.1 7 pages, dated Sep. 29, 2020.

* cited by examiner

*Primary Examiner* — Kimberly N Rizkallah
*Assistant Examiner* — Dilinh P Nguyen
(74) *Attorney, Agent, or Firm* — Ruggiero, McAllister & McMahon LLC

(57) ABSTRACT

This disclosure relates to a cascode HEMT semiconductor device including a lead frame, a die pad attached to the lead frame, and a HEMT die attached to the die pad. The HEMT die includes a HEMT source and a HEMT drain on a first side, and a HEMT gate on a second side. The device further includes a MOSFET die attached to the source of the HEMT die, and the MOSFET die includes a MOSFET source, a MOSFET gate and a MOSFET drain. The MOSFET drain is connected to the HEMT source, and the MOSFET source includes a MOSFET source clip. The MOSFET source clip includes a pillar so to connect the MOSFET source to the HEMT gate, and the connection between the MOSFET source to the HEMT gate is established by a conductive material.

18 Claims, 6 Drawing Sheets

(51) Int. Cl.
   *H01L 21/56*     (2006.01)
   *H01L 23/31*     (2006.01)
(52) U.S. Cl.
   CPC ........ *H01L 21/565* (2013.01); *H01L 23/3107*
         (2013.01); *H01L 23/49503* (2013.01); *H01L
             23/49524* (2013.01); *H01L 23/49562*
             (2013.01); *H01L 23/49568* (2013.01)
(58) Field of Classification Search
   USPC ........................................................ 257/675
   See application file for complete search history.

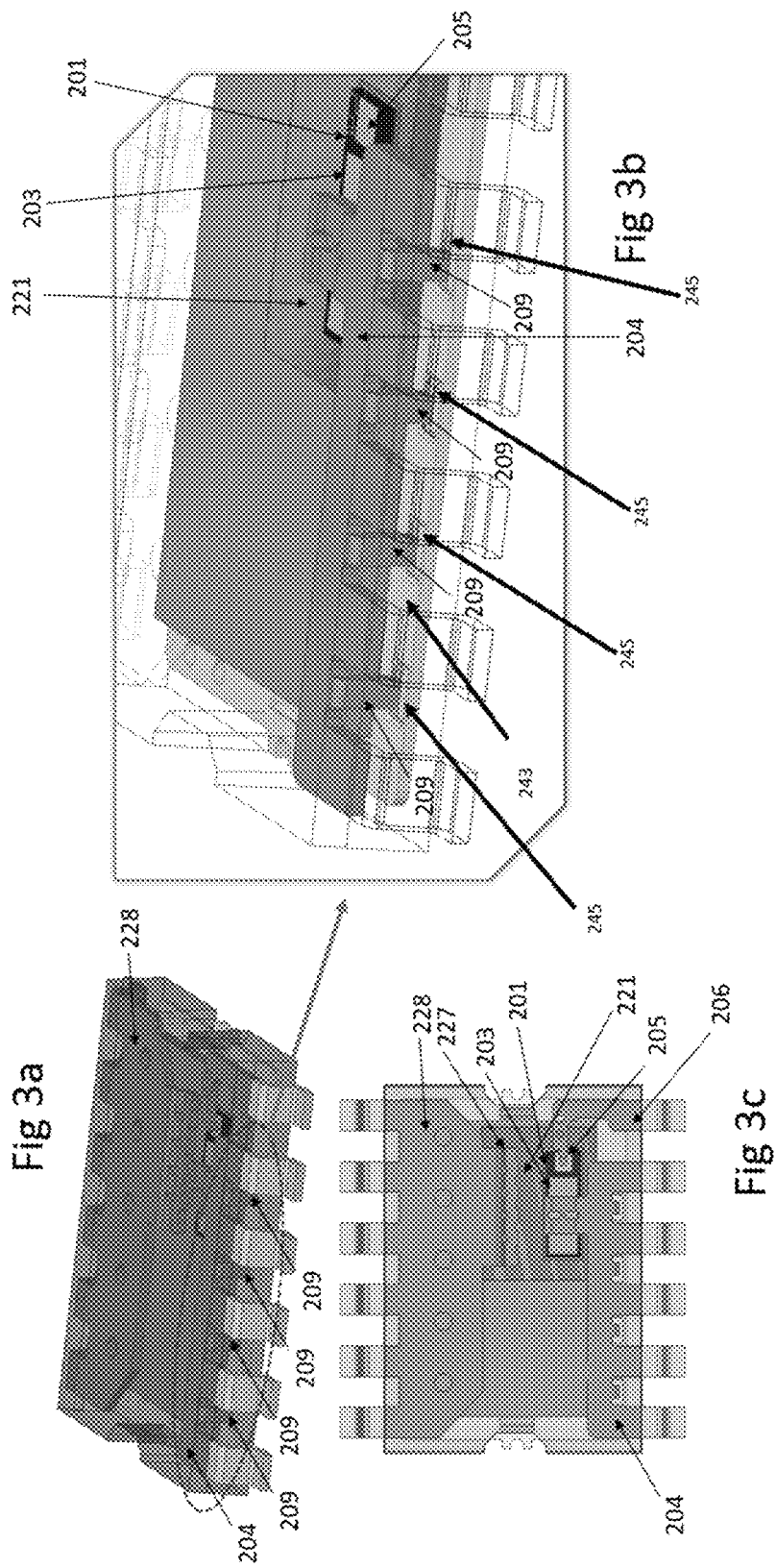

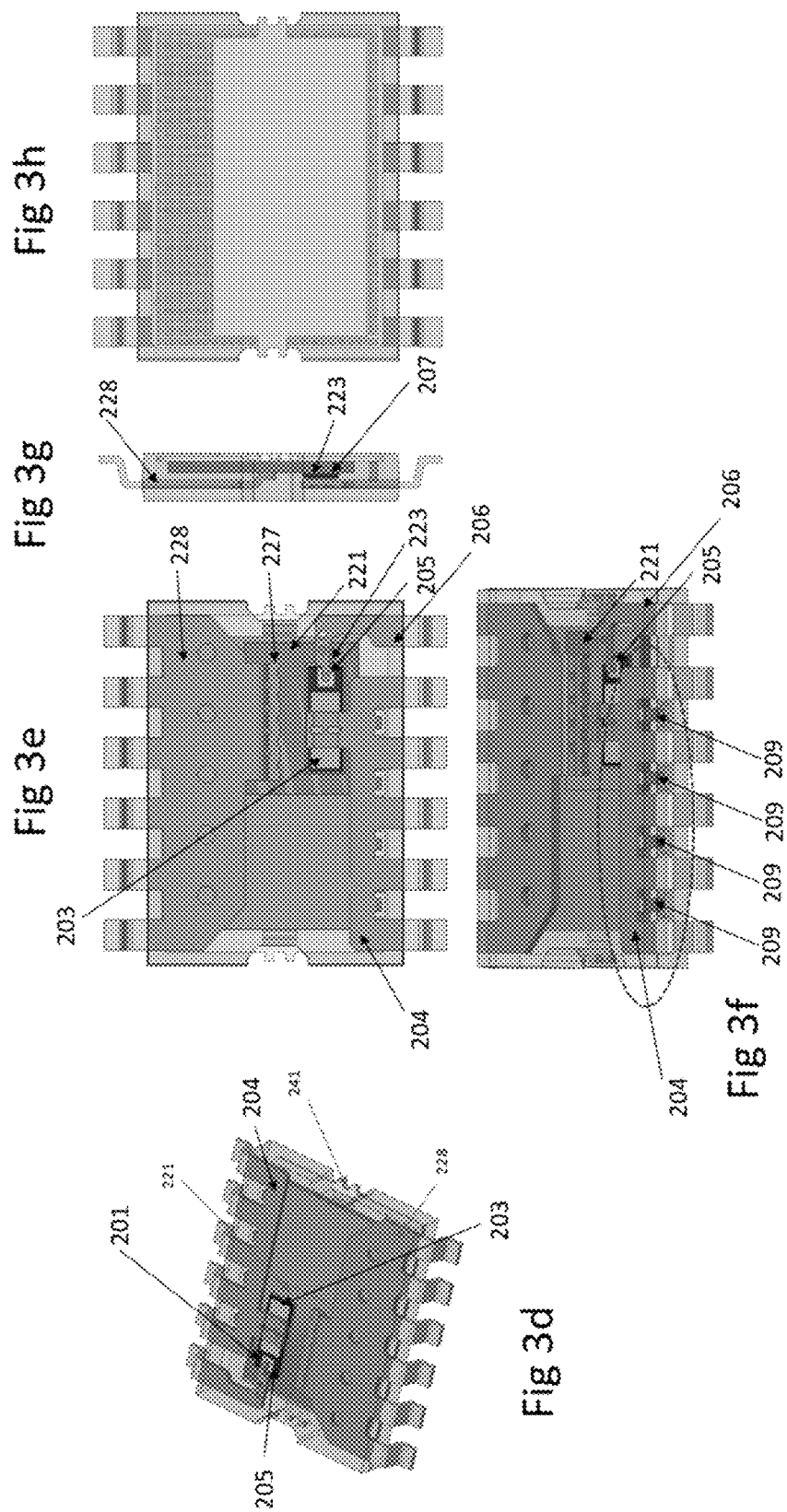

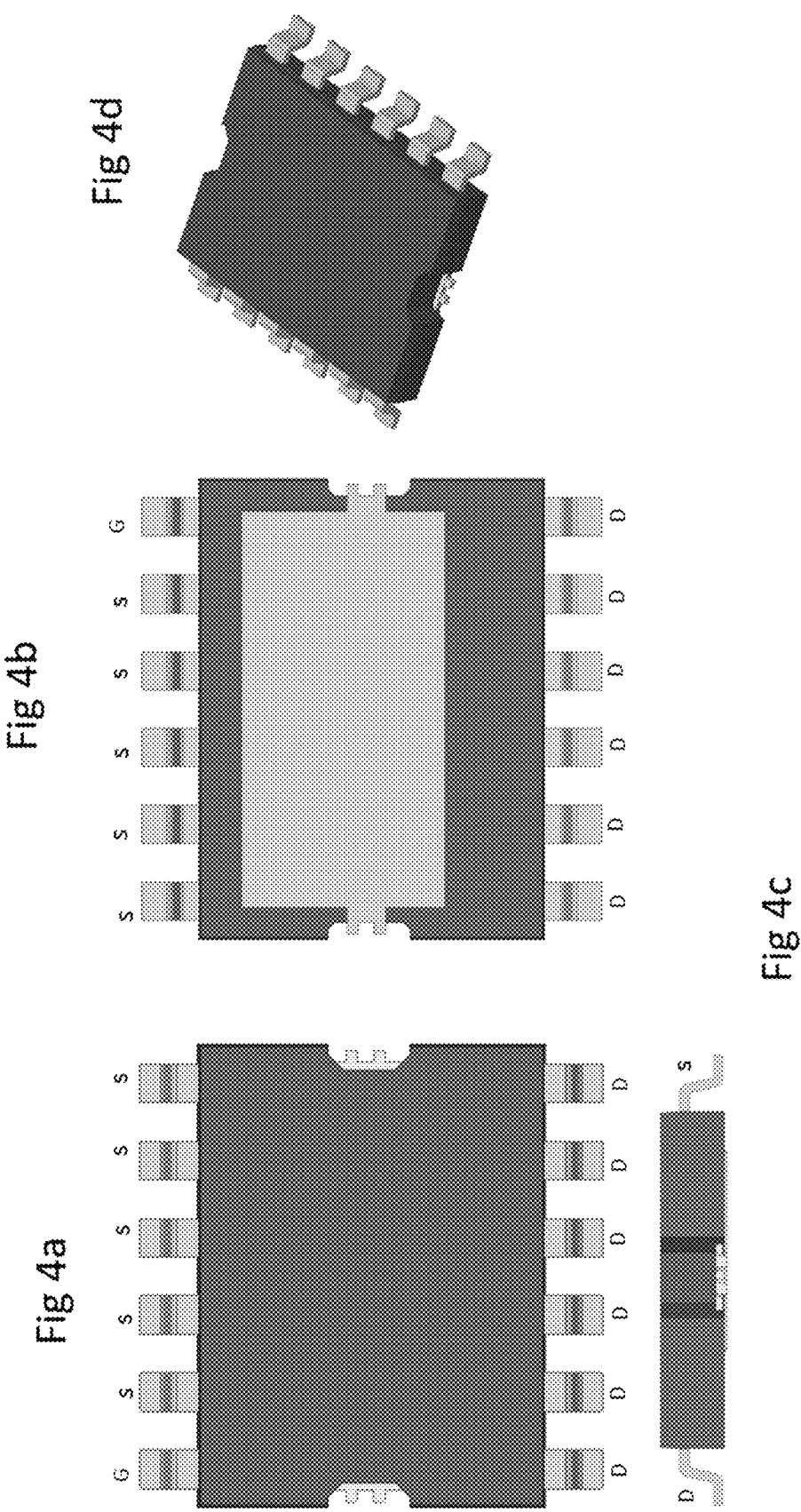

CASCODE SEMICONDUCTOR

CROSS REFERENCE TO RELATED APPLICATION

This application claims the benefit under 35 U.S.C. § 119(a) of European Application No. 20163929.1 filed Mar. 18, 2020 the contents of which are incorporated by reference herein in their entirety.

BACKGROUND OF THE DISCLOSURE

1. Field of the Disclosure

The present disclosure relates to a cascode high electron mobility (HEMT) semiconductor device a method of forming a cascode HEMT semiconductor device. The disclosure also relates to a leadless packaged semiconductor device.

2. Description of the Related Art

FIG. 1 shows a known cascode HEMT semiconductor device. A HEMT die 221 is shown. The HEMT die comprises a HEMT source 223, a HEMT gate 225 and a HEMT drain 227. The HEMT gate 225 is diverted to the bottom of the HEMT die through vias 229.

A metal-oxidesemiconductor field-effect transistor (MOSFET) die 201 is shown in FIG. 1. The MOSFET die comprises a MOSFET source 203, a MOSFET gate 205 and a MOSFET drain 207. The MOSFET drain 207 is connected to the HEMT source 223.

Although not shown in FIG. 1, the MOSFET source 203 is connected to the HEMT gate 225.

One of the main challenges in the packaging of semiconductor components, such as power semiconductor devices, is the heat dissipation. Examples of prior art power packages that have been developed and improved upon to address such issues include the TO-220, TO-218, CASE 77, TO-247, Dpak, D2pak, D3pak, quad flat pack no-lead (QFN), quad flat pack (QFP), small outline (SOP) packages among others.

The known power device packages provide heat dissipation paths from both top and bottom surfaces of the package. In this case the dual heat dissipation paths provide increased current density compared to conventional single dissipation path packages. This also provides an improved junction-to-ambient thermal impedance. Compared to single heat dissipation path packages, the dual heat dissipation path packages can either handle more power or operate with a lower junction temperature. In case of MOSFET devices, a lower junction temperature means a lower drain to source on-resistance. This provides a higher efficiency of the packaged component. A reduction in junction temperature means an increase in product reliability.

A semiconductor package structure having multiple heat dissipation paths is described in US20080054438A1 patent. This package structure is shown in FIG. 2.

The known semiconductor package structure comprises a connective bridge 11, a semiconductor device or electronic device 14, and a lead frame or conductive support structure 17. The semiconductor device 14 can be for a power MOSFET. Semiconductor device 14 is shown with a current carrying electrode 19 formed overlying a major surface 21, and a major surface 22 that includes second current carrying electrodes 23. Major surface 22 further includes a control electrode 24. The current carrying electrode 19 can be a drain electrode, the current carrying electrodes 23 can be source electrodes, and the control electrode 24 corresponds can be a gate electrode of a MOSFET device.

Conductive plate 11 and lead frame 17 comprise a conductive material. Plate 11 includes alignment structures 110 formed on or extending from a major surface 112 of plate 11. The alignment structures 110 are used for coupling as well. These are rectangular like blocks formed at the four corners of plate 11.

Lead frame 17 comprises a plurality of portions or components 170, 171, 172, and 173. Pad portions 170 and 173 correspond to one current carrying electrode. They provide electrical contact between current carrying electrode 19 to an opposite surface of the structure shown in FIG. 2. The pad portions 170 and 173 correspond to drain contacts for the structure. Pad portions 170 and 173 are configured to include alignment features or portions 41. Alignment portions 41 are configured to receive the alignment structures 110 of plate 11. This provides a consistent alignment and planarity feature for the structure and planarity control of plate 11 with respect to semiconductor 14.

Pad portion 172 is a gate electrode contact. The pad portion 172 includes an elevated contact portion or pedestal 272 configured or placed to couple with or bond to control electrode 24 of semiconductor device 14.

Pad portion 171 is electrically coupled to the current carrying electrodes 23 of semiconductor device 14. Pad portions 170, 171, 172, and 173 are held together with a frame and tie bar portions, which are subsequently removed during the assembly process. These conventional structures are not shown in FIG. 2.

Packaged semiconductor device comprises a heat dissipation path device because heat is dissipated out of both surfaces of the packaged semiconductor device. Specifically, heat is dissipated through plate 11 exposed at or on the upper surface, and through pad portions 170, 172, and 173 exposed on opposite, lower surface.

The disadvantage of prior art is that the coupling of portion 110 to portion 41 fully rely on how optimised the positional accuracy and tolerance for them to be fully integrated. Any miscalculation will impact coplanarity that will impact heat dissipation and power efficiency.

SUMMARY

Various example embodiments are directed to the disadvantage as described above and/or others which may become apparent from the following disclosure.

According to an embodiment of this disclosure a cascode HEMT semiconductor device comprises a lead frame, and a die pad attached to the lead frame.

The cascode HEMT semiconductor device further comprises a first lateral silicon die, e.g. a HEMT die. The HEMT die attached to the die pad. The HEMT die comprises a HEMT source and a HEMT drain on its first side and a HEMT gate on its second side. The HEMT drain comprises a HEMT drain clip.

The cascode HEMT semiconductor device further comprises a second lateral silicon die, e.g. a MOSFET die. The MOSFET die is attached to the source of the HEMT die. The MOSFET die comprises a MOSFET source, a MOSFET gate and a MOSFET drain. The MOSFET drain is connected to the HEMT source. The MOSFET source comprises a MOSFET source clip. The MOSFET source clip comprises at least one pillar that is arranged to connect the MOSFET source to the HEMT gate. This is established by connecting the pillar to the die pad, since the HEMT gate is connected to the die pad.

In an embodiment of the disclosure the connection between the pillar and the die pad, i.e. the connection between the MOSFET source to the HEMT gate, is not direct, but it is established by a conductive material. Some of the examples of such a conductive material are a solder, a paste, a sintering material, a welding, etc.

According to an embodiment of this disclosure a cascode HEMT semiconductor device is a gallium nitride (GaN) device.

According to an embodiment of this disclosure the pillars are 90 degrees pillars.

According to an embodiment of this disclosure the die pad comprises an indentation, wherein the indentation is arranged to avoid a direct contact between the die pad and the pillar. The contact is established by above mentioned conductive material.

The indentation can be in any suitable size range, for example between 10-100 μm. In an embodiment of the disclosure the indentation is around 50 μm.

According to an embodiment of this disclosure the MOSFET source clip comprises multiple pillars so to connect the MOSFET source to the HEMT gate. This provides improved stability and reliability of the connection between the MOSFET source and the HEMT gate. Even if one (or more) of the pillars is disconnected, the connection between the MOSFET source and the HEMT gate will exist as long as at least one of the pillars is connected to the die pad.

According to an embodiment of this disclosure the die pad comprises a separate indentation for each of the multiple pillars. This arrangement provides improved stability and reliability.

According to an embodiment of this disclosure an automotive part comprises a cascode HEMT semiconductor device as specified in any of the previous embodiments above.

An embodiment of this disclosure relates to a method of forming a cascode HEMT semiconductor device. The method comprises the following steps. Forming a die pad with an indentation. Apply a first solder, or any conductive material, on the die pad for a HEMT die and for a pillar of a MOSFET source clip of a MOSFET die.

Attach the HEMT die. Apply a second solder, or any conductive material, on top of the HEMT die for a HEMT source and HEMT drain, wherein a HEMT gate is diverted at the back of the HEMT die.

Attach the MOSFET die. A MOSFET source and a MOSFET gate are provided on the top of the MOSFET die. A MOSFET drain is provided at the bottom of the MOSFET die. The MOSFET drain is attached to the HEMT source. Apply a third solder, or any conductive material, on the top of the MOSFET die for the MOSFET source and the MOSFET gate.

Form a HEMT drain clip for the HEMT drain. Form the MOSFET source clip for the MOSFET source. Form a MOSFET gate clip for the MOSFET gate.

Connect the MOSFET source clip to the indentation of the die pad using a conductive material. In this way the connection between the MOSFET source and the HEMT gate is established.

Further semiconductor device production typical steps are executed. Moulding for all units so to encapsulate the silicon. This encapsulation is required to protect the silicon dies from any oxidation and contamination. The plating step for the units. In this way it will plate any exposed copper in an assembled unit. This enables that the product can be soldered on a printed circuit board (PCB) footprint. Also, the Cu contamination is avoided. The dambar will be further removed so that the leads will become independent terminals of the package. The leads will be cut and trimmed. Gull wing leads for surface mounting will be formed. On the end the singulation of units will be done by cutting the side tie bars. The tie bars are the only part of lead frame that holds the unit after all steps.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

FIGS. 3a-h illustrate a cascode HEMT semiconductor device according to embodiments.

FIGS. 4a-d illustrate a cascode HEMT semiconductor device according to embodiments after singulation.

DETAILED DESCRIPTION

Figure 1:
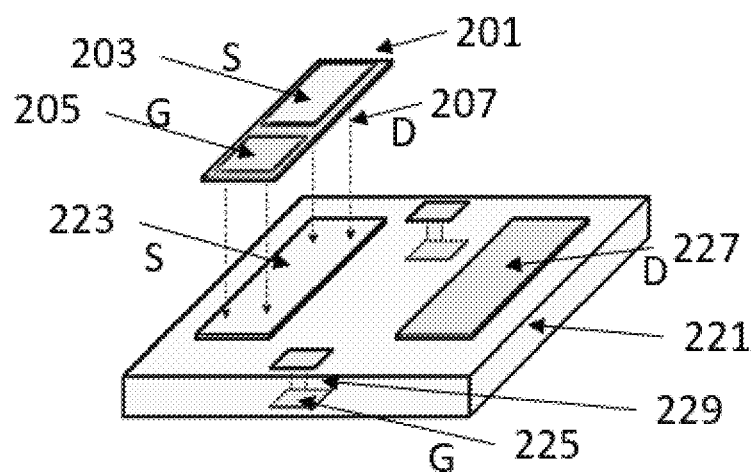
FIG. 1 shows a known cascode HEMT semiconductor device.
Figure 2:
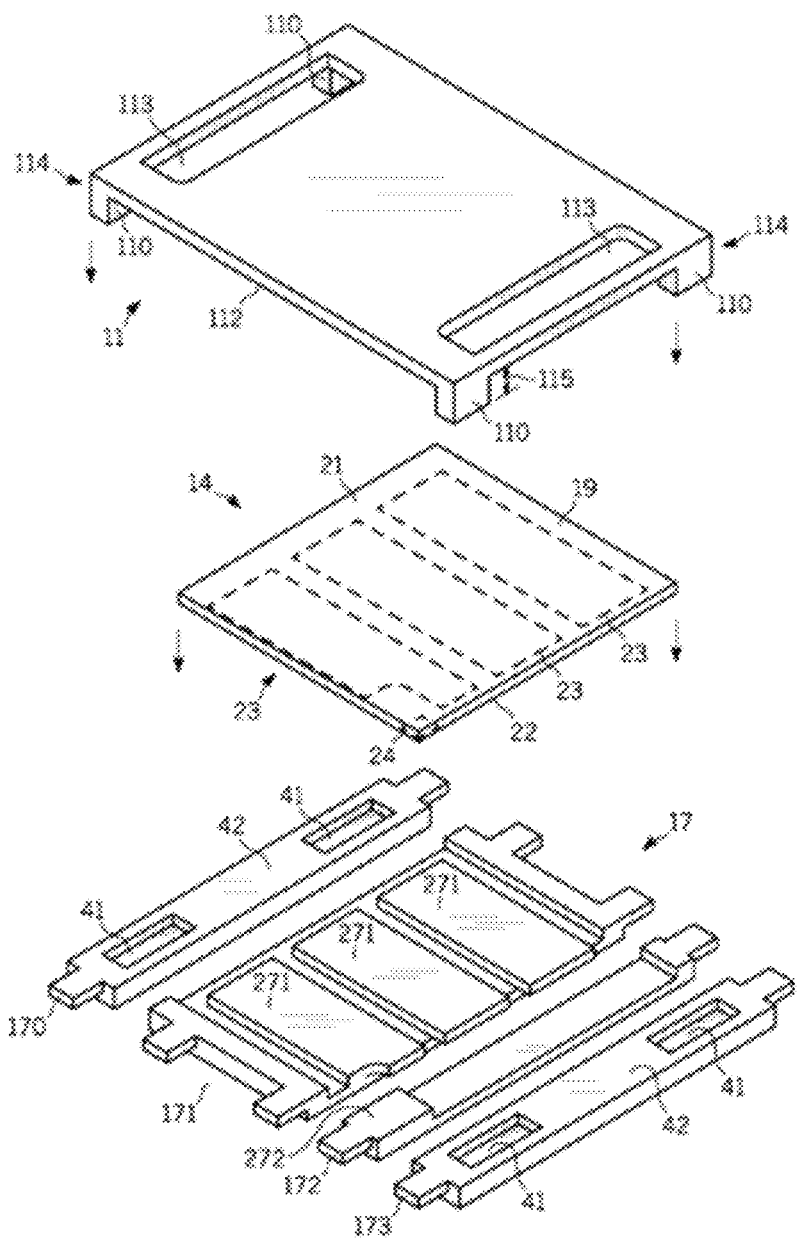
FIG. 2 shows a known semiconductor package structure having multiple heat dissipation paths.

In the figures and the following description like reference numerals refer to like features. FIGS. 3a-h illustrate a cascode HEMT semiconductor device according to embodiments. These figures illustrate the cascade HEMT semiconductor device from different view angles.

The device comprises a lead frame 241, wherein a HEMT die 221 is attached on the lead frame 241. In an embodiment of the disclosure a matrix of die pad is attached to the lead frame 241. The HEMT die comprises a HEMT source 223, a HEMT gate 225 and a HEMT drain 227. The HEMT gate 225 is diverted to the bottom of the HEMT die through vias 229. The HEMT gate 225 is connected to the die pad 243. The HEMT drain 227 comprises a HEMT drain clip 228. The HEMT drain clip 228 is used to create external leads, also called terminals, for the HEMT drain connection.

A MOSFET die 201 comprises a MOSFET source 203, a MOSFET gate 205 and a MOSFET drain 207. The MOSFET die 201 is arranged on the HEMT die 221 so that the MOSFET drain 207 is connected to the HEMT source 223 as shown in FIG. 3g. The MOSFET source 203 comprises a MOSFET source clip 204 as shown in FIGS. 3a, 3b and 3c. The MOSFET source clip 204 comprises one or more pillars 209 as shown in FIGS. 3a and 3b.

These pillars 209 are arranged to connect the MOSFET source 203 to the HEMT gate 225. The connection between the MOSFET source 203, via the MOSFET source clip 204 and the pillars 209, to the HEMT gate 225 is established by a conductive material 245, as shown in the FIG. 3b. The conductive material 245 can be any conductive adhesive, such as a solder, a paste, a sintering material, a welding, etc.

This arrangement, wherein the MOSFET source clip 204 is connected to the die pad 243 using one or more pillars 209, secures that the connection to the die pad 243 is improved with an indentation in the die pad 243 at the point where the pillars 209 connect. Thus, there is no direct connection between the die pad 243 and pillars 209. They are connected with each other via a conductive adhesive 245. Said indentation filled by the conductive adhesive is shown in FIG. 3b.

In this embodiment of the disclosure, as an example, a MOSFET die is described. However, it can be also any other semiconductor device such as a power MOSFET, insulated gate bipolar transistor, a bipolar transistor, a JFET device, a MESFET device, a thyristor, a diode, or the like.

A cascode HEMT semiconductor device can be a gallium nitride (GaN) device, a clip bonded product, a half bridge GaN product, or a product with a dual cascode inside a package, or any similar product.

The innovation is applicable to all semiconductor packages using clip as interconnects that are integrated to leads or internal clips.

A cascode HEMT semiconductor device, wherein one of the embodiments is described above and shown in FIGS. 3a-h, the usage of pillars 209 will improve the thermal performance of the device by providing a path for the heat to spread between the top and the bottom of the device, before being removed from the device through the base or the leads.

Moreover, such a cascode HEMT semiconductor device, wherein one of the embodiments is described above and shown in FIGS. 3a-h, is arranged to reduce the parasitic inductance and resistance of the package, compared to the known packages, through the use of clips and multiple pillars connected to the die pad 243, which is acting as a heatsink.

Usage of multiple pillars 209 provides that a cascode HEMT semiconductor device will be more reliable. Even in case that one of the pillars 209 is disconnected from the die pad 243, the connection will still be established if at least one of the pillars 209 is connected, i.e. it will not result to an open circuit.

The reliability of a cascode HEMT semiconductor device will be further improved by the addition of an indentation on the die pad, or a gap in between the pillars and the die pad. For example, the indentation can be about 10-100 µm, preferably about 50 µm. The gap can be for example between 10-50 µm. This is designed so that the pillars 209 not to touch the die pad. By avoiding the pillars touching the die pad, the probability of an open connection between the HEMT drain clip 228 or the MOSFET source clip 204 is reduced during a moulding process.

The pillars can be about 90 degrees pillars. The connection of the pillars 209 to the die pad can be done with or without the use of an indentation on the die pad 243 at the point where the pillars 209 connect to the die pad 243, as long as there is a 10-50 µm gap in between pillars 209 and die pad 243 for a conductive material 245, e.g. a conductive adhesive. The pillars 209 are arranged to improve parasitic and thermal performance of a cascode HEMT semiconductor device as it will distribute or spread electrical and thermal towards the bottom heatsink faster.

Such a design can be applied on a gull wing and other very cost-effective materials.

Such a design has no limitation on creepage and clearance. FIGS. 4a-d illustrate an embodiment of the disclosure wherein a cascode HEMT semiconductor device after singulation is shown.

Figure 5:
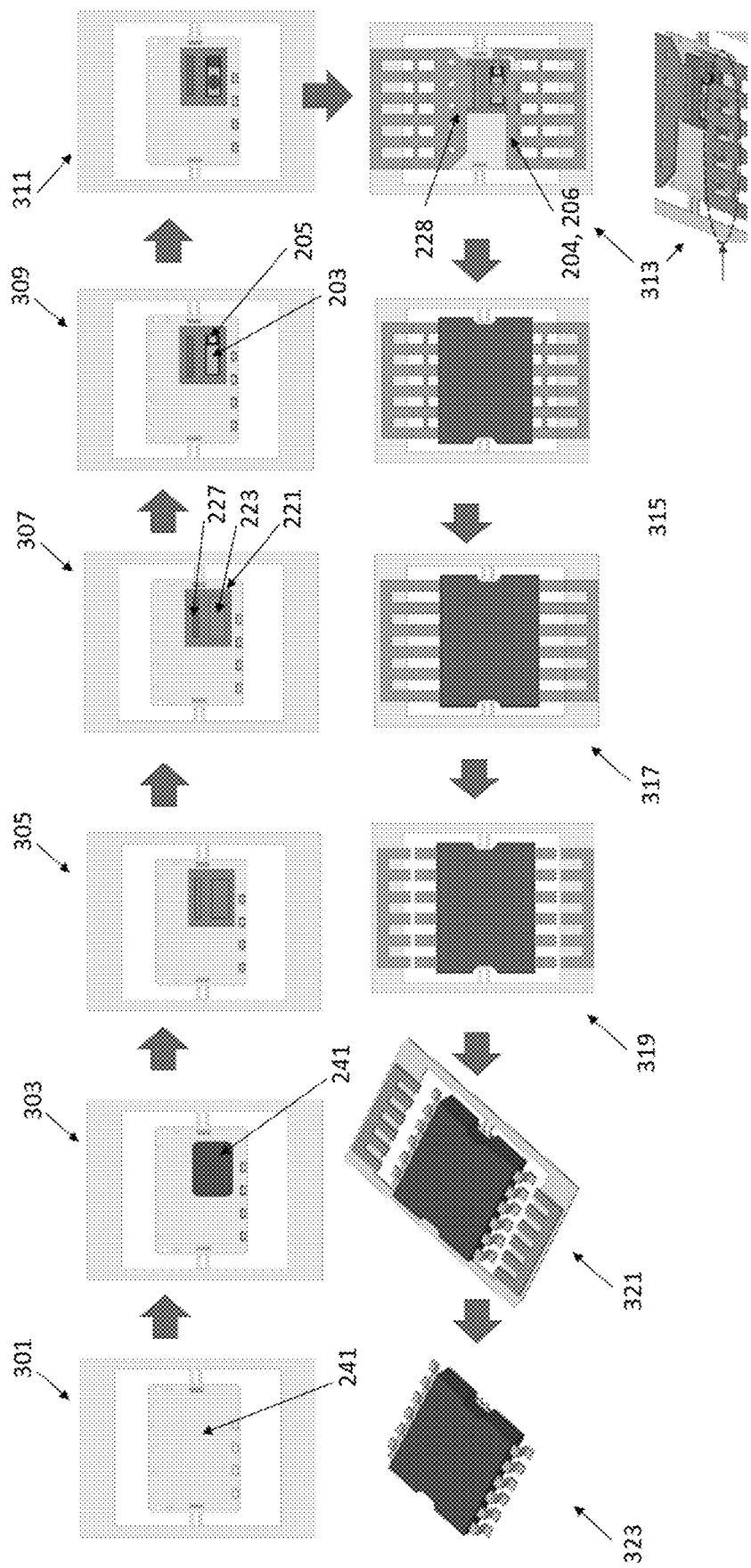
FIG. 5 illustrates process flow steps for forming a cascode HEMT semiconductor device according to embodiments.

FIG. 5 illustrates process flow steps for forming a cascode HEMT semiconductor device according to an embodiment of the disclosure. The process flow comprises the steps:

step 301: forming a die pad 241 with or without indentation;

step 303: print, write or dispense a solder on die pad 241; one big solder for a HEMT die 221 and multiple (e.g. four as in an example shown in step 303) single solders for pillars 209 of a MOSFET source clip 204;

step 305: attach a first lateral silicon die; in an embodiment of the disclosure a HEMT die 221 is attached; the attaching on the printed solder can be done using die attach machine;

step 307: print, write or dispense a solder on top of the first lateral silicon die, in this example it is the HEMT die 221, for a HEMT source 223 and HEMT drain 227; a HEMT gate 225 is diverted at the back of the HEMT die 221 for above explained functionality improvement purposes;

step 309: attach another silicon vertical die, in this case a MOSFET die 201, wherein a MOSFET source 203 and a MOSFET gate 205 are located on the top, while a MOSFET drain 207 is located at the bottom of the MOSFET die 201; the MOSFET drain 207 is in this way attached to the HEMT source 223 of the HEMT die 221; this is done using another set of die attach machine arranged to connect the HEMT source 223 to the MOSFET drain 207;

step 311: print, write or dispense a solder on top of the second silicon die, in this example embodiment a MOSFET die, for a MOSFET source 203 and a MOSFET gate 205;

step 313: providing a HEMT drain clip 228 for the HEMT drain 227, and providing a MOSFET source clip 204 for the MOSFET source 203 together with a MOSFET gate clip 206 for the MOSFET gate 205; further, a reflow will be done for all units for solder curing;

step 315: perform moulding for all units so to encapsulate the silicon; an encapsulation is required to protect the silicon dies from any oxidation and contamination; further plating step for the units will be done, wherein it will plate any exposed copper (Cu) in an assembled unit; plating is required to ensure that the product can be soldered on a printed circuit board (PCB) footprint as well as to avoid Cu contamination;

step 317: dambar cutting step will be executed, wherein it will remove the dambar connecting all leads together; consequently, the leads will become independent terminals of the package;

step 319: cutting and trimming the leads;

step 321: forming of gull wing leads for surface mounting; and step 323: singulation of units by cutting the side tie bars; the tie bars are the only part of lead frame that holds the unit after all processes.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A cascode high electron mobility (HEMT) semiconductor device comprising:
   a lead frame;
   a die pad attached to the lead frame;
   a HEMT die attached to the die pad, wherein the HEMT die further comprises:
      a HEMT source and a HEMT drain on a first side, wherein the HEMT drain further comprises a HEMT drain clip, and
      a HEMT gate on a second side,
   a metal-oxide-semiconductor field-effect transistor (MOSFET) die attached to
   a source of the HEMT die, wherein the MOSFET die further comprises:
      a MOSFET source, a MOSFET gate and a MOSFET drain,
   wherein the MOSFET drain is connected to the HEMT source,
   wherein the MOSFET source further comprises a MOSFET source clip,
   wherein the MOSFET source clip further comprises a pillar to connect the MOSFET source to the HEMT gate,
   wherein the connection between the MOSFET source to the HEMT gate is established by a conductive material.

2. The cascode HEMT semiconductor device as claimed in claim 1, wherein the device is a gallium nitride (GaN) device.

3. The cascode HEMT semiconductor device as claimed in claim 2, wherein the MOSFET source clip further comprises multiple pillars to connect the MOSFET source to the HEMT gate.

4. The cascode HEMT semiconductor device as claimed in claim 1, wherein the pillar is a 90 degrees pillar.

5. The cascode HEMT semiconductor device as claimed in claim 4, wherein the MOSFET source clip further comprises multiple pillars to connect the MOSFET source to the HEMT gate.

6. An automotive part comprising the cascode HEMT semiconductor device as claimed in claim 4.

7. The cascode HEMT semiconductor device as claimed in claim 1, wherein the die pad further comprises an indentation, wherein the indentation is configured to avoid a direct contact between the die pad and the pillar.

8. The cascode HEMT semiconductor device as claimed in claim 7, wherein the indentation is in a range between 10-100 μm.

9. The cascode HEMT semiconductor device as claimed in claim 8, wherein the MOSFET source clip further comprises multiple pillars to connect the MOSFET source to the HEMT gate.

10. An automotive part comprising the cascode HEMT semiconductor device as claimed in claim 8.

11. The cascode HEMT semiconductor device as claimed in claim 7, wherein the indentation is about 50 μm.

12. The cascode HEMT semiconductor device as claimed in claim 11, wherein the MOSFET source clip further comprises multiple pillars to connect the MOSFET source to the HEMT gate.

13. The cascode HEMT semiconductor device as claimed in claim 7, wherein the MOSFET source clip further comprises multiple pillars to connect the MOSFET source to the HEMT gate.

14. An automotive part comprising the cascode HEMT semiconductor device as claimed in claim 7.

15. The cascode HEMT semiconductor device as claimed in claim 1, wherein the MOSFET source clip further comprises multiple pillars to connect the MOSFET source to the HEMT gate.

16. The cascode HEMT semiconductor device as claimed in claim 15, wherein the die pad further comprises a separate indentation for each of the multiple pillars.

17. An automotive part comprising the cascode HEMT semiconductor device as claimed in claim 1.

18. A method of forming a cascode high electron mobility (HEMT) semiconductor device comprising:
   attaching a die pad attached to a lead frame;
   attaching a HEMT die to the die pad, wherein the HEMT die further comprises:
      a HEMT source and a HEMT drain on a first side, wherein the HEMT drain further comprises a HEMT drain clip, and
      a HEMT gate on a second side; and
   attaching a metal-oxide-semiconductor field-effect transistor (MOSFET) die to a source of the HEMT die, wherein the MOSFET die further comprises:
      a MOSFET source, a MOSFET gate and a MOSFET drain,
   wherein the MOSFET drain is connected to the HEMT source,
   wherein the MOSFET source further comprises a MOSFET source clip,
   wherein the MOSFET source clip further comprises a pillar to connect the MOSFET source to the HEMT gate, and
   wherein the connection between the MOSFET source to the HEMT gate is established by a conductive material.

* * * * *